United States Patent
Nagata et al.

(10) Patent No.: US 10,589,387 B2
(45) Date of Patent: Mar. 17, 2020

(54) AU—SN—AG-BASED SOLDER ALLOY AND SOLDER MATERIAL, ELECTRONIC COMPONENT SEALED WITH THE SAME AU—SN—AG BASED SOLDER ALLOY OR SOLDER MATERIAL, AND ELECTRONIC COMPONENT MOUNTING DEVICE

(71) Applicant: SUMITOMO METAL MINING CO., LTD., Tokyo (JP)

(72) Inventors: Hiroaki Nagata, Tokyo (JP); Eiji Murase, Tokyo (JP); Toshikazu Shimizu, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 278 days.

(21) Appl. No.: 15/525,811

(22) PCT Filed: Aug. 27, 2015

(86) PCT No.: PCT/JP2015/074211
§ 371 (c)(1),
(2) Date: May 10, 2017

(87) PCT Pub. No.: WO2016/075983
PCT Pub. Date: May 19, 2016

(65) Prior Publication Data
US 2018/0326543 A1    Nov. 15, 2018

(30) Foreign Application Priority Data
Nov. 11, 2014  (JP) ................. 2014-228793

(51) Int. Cl.
*B23K 35/30*    (2006.01)
*C22C 5/02*    (2006.01)
(Continued)

(52) U.S. Cl.
CPC .......... *B23K 35/3013* (2013.01); *B23K 35/30* (2013.01); *C22C 1/02* (2013.01);
(Continued)

(58) Field of Classification Search
CPC ...... B23K 35/3013; B23K 35/30; C22C 1/02; C22C 5/02; H05K 3/34; H05K 3/3457; H05K 1/18
See application file for complete search history.

(56) References Cited

FOREIGN PATENT DOCUMENTS

EP        2202326 A1 *  6/2010  ............... C22C 9/06
JP        11-077366     3/1999
(Continued)

OTHER PUBLICATIONS

International Search Report dated Nov. 24, 2015 in International (PCT) Application No. PCT/JP2015/074211.

*Primary Examiner* — Anthony J Zimmer
*Assistant Examiner* — Ricardo D Morales
(74) *Attorney, Agent, or Firm* — Wenderoth, Lind & Ponack, L.L.P.

(57) ABSTRACT

An Au—Sn—Ag-based solder alloy for high temperature use containing Sn, Ag, Au and elements that are inevitably contained owing to manufacture procedure, wherein the Au—Sn—Ag-based solder alloy has a composition adjusted so that a solidus temperature is within a range of 280 to 400° C. with a gap between the solidus temperature and the liquidus temperature being within 40° C. The Au—Ag—Sn-based solder alloy has low cost, and is excellent in solderability, reflow wettability and reliability. The excellent reflow wettability of the Au—Ag—Sn-based solder alloy allows it to be useful in reflow bonding of crystal quartz devices, SAW filters and MEMS.

9 Claims, 1 Drawing Sheet

(51) Int. Cl.
*H05K 3/34* (2006.01)
*C22C 1/02* (2006.01)
*B23K 101/36* (2006.01)

(52) U.S. Cl.
CPC ............. *C22C 5/02* (2013.01); *H05K 3/34* (2013.01); *H05K 3/3457* (2013.01); *B23K 2101/36* (2018.08)

(56) References Cited

FOREIGN PATENT DOCUMENTS

| | | |
|---|---|---|
| JP | 2002-160089 | 6/2002 |
| JP | 2008-155221 | 7/2008 |
| JP | 2008155221 A * | 7/2008 |
| JP | 2009-190055 | 8/2009 |
| JP | 2009-220147 | 10/2009 |
| JP | 2014-151329 | 8/2014 |
| WO | 2006/049024 | 5/2006 |
| WO | 2010/010833 | 1/2010 |

* cited by examiner

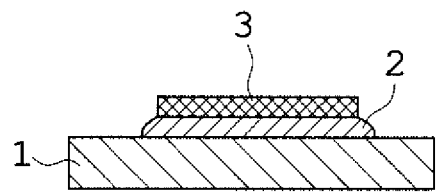

AU—SN—AG-BASED SOLDER ALLOY AND SOLDER MATERIAL, ELECTRONIC COMPONENT SEALED WITH THE SAME AU—SN—AG BASED SOLDER ALLOY OR SOLDER MATERIAL, AND ELECTRONIC COMPONENT MOUNTING DEVICE

TECHNICAL FIELD

The present invention relates to a high-temperature type Pb-free solder alloy excellent in reflow wettability and solderability. The present invention also relates to a solder alloy and a solder material containing Au as a main component, and an electronic component sealed with the solder alloy or the solder material.

BACKGROUND ART

In recent years, regulations against chemicals harmful to the environment have got stricter and stricter. Solder materials to be used for bonding electronic components to substrates are not an exception to such regulations. While lead has been used as a main component of solder materials through the ages, it has already been designated as a regulated substance by RoHS directive and similar. Therefore, a solder material that does not contain lead (Pb) (hereinafter referred to as lead-free solder material or unleaded solder material) is under active development.

Solder materials to be used in bonding electronic components to substrates are roughly classified, by limit temperature for use, into a high temperature type (about 260° C.~400° C.) and a medium-to-low temperature type (about 140° C.~230° C.). Of the high temperature type and the medium-to-low temperature type, regarding the medium-to-low temperature type solder materials, lead-free solder materials containing Sn as a main component have been put into practical use.

For example, as a lead-free solder material for medium-to-low temperature use, Japanese Patent KOKAI No. 11-77366 listed as Patent Document 1 discloses an unleaded solder alloy composition containing Sn as a main component, Ag of 1.0~4.0 wt %, Cu of 2.0 wt % or less, Ni of 1.0 wt % or less, and P of 0.2 wt % or less.

On the other hand, with respect to Pb-free solder materials for high temperature use also, various organizations are engaged in development. For example, Japanese Patent KOKAI No. 2002-160089 listed as Patent Document 2 discloses a hermetic seal terminal using, as a solder material, a Bi—Ag alloy film containing 30~80 mass % Bi.

As Au-based, Pb-free solder materials for high-temperature use, Au—Sn alloys and Au—Ge alloys have already been used in crystal devices, SAW filters, and mount devices for electronic components such as MEMS.

As an Au-based Pb-free solder material for high-temperature use that has been put to practical use, there is counted Au-20 mass % Sn (this means that it is composed of 80 mass % Au and 20 mass % Sn; the same notation applies hereinafter also). It has a eutectic composition and has a melting point at 280° C.

Au-12.5 mass % Ge, which also has been put into practical use, has a eutectic composition and has a melting point at 356° C.

Au—Sn alloys and Au—Ge alloys are differently used in accordance with the difference in melting point. A mount device using a high-temperature type solder material is required to have a heat resistance of 260° C. at lowest. Therefore, Au—Sn alloys having a melting point at 280° C. are mainly used for mount devices requiring heat resistance about 260° C. In a case where a heat resistance higher than 280° C. is required, an Au—Ge alloy is used.

Owing to the melting point property and good reflow wettability, Au—Sn alloys are used for sealing quartz crystal devices, which, in particular, are required to have high reliability. However, Au-based alloys are much harder than Pb-based solder alloys or Sn-based solder alloys, and are very difficult to process into a sheet form. Accordingly, productivity and yield are rendered poor, to raise the cost. In addition, Au-based alloys require extremely high raw material costs as compared with Pb-based solder alloys or Sn-based solder alloys. Thus, more inexpensive products are needed. For the purpose of making the Au—Sn alloys inexpensive and highly usable, there has been developed, for example, an Au-based solder material as shown in Patent Document 3.

Japanese Patent KOKAI No. 2008-155221 listed as Patent Document 3 discloses a brazing filler material having a composition ratio (Au (wt %), Ag (wt %), Sn (wt %)) residing within a region surrounded by the points A1 to A5 below on a ternary composition diagram of Au, Ag and Sn:

Point A1 (41.8, 7.6, 50.5),
Point A2 (62.6, 3.4, 34.0),
Point A3 (75.7, 3.2, 21.1),
Point A4 (53.6, 22.1, 24.3),
Point A5 (30.3, 33.2, 36.6).

Its object is to provide a brazing filler material and a piezoelectric device that have a relatively low melting point and thus are easy to handle, are excellent in strength and adhesion and are inexpensive.

PRIOR ART DOCUMENTS

Patent Documents

Patent Document 1: Japanese Patent KOKAI No. 11-77366
Patent Document 2: Japanese Patent KOKAI No. 2002-160089
Patent Document 3: Japanese Patent KOKAI No. 2008-155221

SUMMARY OF THE INVENTION

Problems to be Solved by the Invention

Although various organizations are engaged in development of Pb-free solder materials for high temperature use not limited to those of the above cited references, a versatile solder material available at a low cost has not yet been found. In general, materials having relatively low heatproof temperature such as thermoplastic resin and thermosetting resin are commonly used for electronic components and substrates. Therefore, even in the case of high temperature use, it is necessary to control the working temperature to be lower than 400° C., desirably 370° C. or lower. However, for example in a case where the Bi—Ag alloy disclosed in Patent Document 2 is used as a brazing material, since the liquidus temperature is high, or to be 400~700° C., the working temperature during bonding is required to be higher than 400~700° C., which often exceeds the heatproof temperature of the electronic components and the substrates to be bonded together; the alloy is applicable to very limited electronic components and substrates.

Au—Sn-based solder materials and Au—Ge-based solder materials in practical use are used for soldering portions where a high reliability is particularly required, such as crystal quartz devices, SAW filters and MEMS. They, however, are not widely or popularly used. In addition, Au-based solder materials are very hard and less processable. Thus, rolling them into a sheet form, for example, takes a long time and requires a special, less damageable material for the roller, to raise the cost. In press molding also, the hard and brittle nature of the Au-based solder materials easily generates cracks and burrs, to result in a poor yield as incomparable with those of other solder materials and accordingly, very high cost. In the case of processing into a wire form, their hardness is a bottleneck; even use of an extruder with a very high pressure cannot assure sufficient extrusion speed, and only one over few hundreds productivity in reference to Pb-based solder materials is expected.

Patent Document 3 defines the composition as having a composition ratio (Au (wt %), Ag (wt %), Sn (wt %)) residing within a region surrounded by the points A1 to A5 below on a ternary composition diagram of Au, Ag and Sn:
  Point A1 (41.8, 7.6, 50.5),
  Point A2 (62.6, 3.4, 34.0),
  Point A3 (75.7, 3.2, 21.1),
  Point A4 (53.6, 22.1, 24.3),
  Point A5 (30.3, 33.2, 36.6).

Its object is to provide a brazing filler material and a piezoelectric device that have a relatively low melting point and thus are easy to handle, are excellent in strength and adhesion and are inexpensive.

According to Patent Document 3, since the blazing filler material is used as being melted all at once with a strong power of a laser, any composition having a melting point between 236° C. and 498° C. shows a good wettability. However, the solidus temperature and the liquidus temperature are far apart from each other in many of Examples 1 to 10. The wettability entered in Table 2 of Patent Document 3 is data showing sealing property, different from general wetting spreadability; reflow wettability is unknown.

On the other hand, in a soldering process using a generally used reflow oven, the heating rate is about 2° C./sec, and thus the melting rate is slower than by laser melting. Therefore, if the solidus temperature and the liquidus temperature are separated by 40° C. or wider, melting proceeds not uniformly and melting separation occurs, which may cause problems in reflow wettability.

The present invention is made in view of such circumstances, and its object is to provide, at a low cost, an Au—Ag—Sn-based solder alloy for high temperature use that is so good at reflow wettability as to be sufficiently usable in reflow bonding of crystal quartz devices, SAW filters, MEMS and the like and is excellent in processability and reliability also.

Measures to Solve the Problems

Therefore, in order to attain the above-mentioned object, an Au—Sn—Ag-based solder alloy according to the present invention contains Sn, Ag, Au and elements that are inevitably contained owing to a procedure for manufacturing, characterized by having a composition adjusted so that the solidus temperature is within 280~400° C. with the gap between the solidus temperature and the liquidus temperature being within 40° C.

Also, according to the present invention, it is preferable that Sn of 21.1 mass % or more and less than 31.0 mass % is contained and Ag of 0.1 mass % or more but 12.5 mass % or less is contained, wherein a balance is made up by Au except for the elements that are inevitably contained owing to the procedure for manufacturing.

Also, according to the present invention, it is preferable that Sn of 21.1 mass % or more and less than 31.0 mass % is contained and Ag of 0.1 mass % or more but 8.0 mass % or less is contained, wherein a balance is made up by Au except for the elements that are inevitably contained owing to the procedure for manufacturing.

Also, according to the present invention, it is preferable that Sn of 21.1 mass % or more and less than 27.5 mass % is contained and Ag of 3.0 mass % or more but 8.0 mass % or less is contained, wherein a balance is made up by Au except for the elements that are inevitably contained owing to the procedure for manufacturing.

Also, according to the present invention, it is preferable that the surface roughness after rolling is 1 μm or less.

Also, according to the present invention, it is preferable that the cooling rate during casting is 3° C./sec or more.

On the other hand, a solder material of the present invention is characterized by being processed into a frame shape, a sheet shape or a ribbon shape by use of the above-mentioned Au—Ag—Sn-based solder alloy.

Also, an electronic component according to the present invention is characterized by being sealed up by use of the above-mentioned Au—Ag—Sn-based solder alloy or the above-mentioned solder material.

Also, an electronic component mounting device according to the present invention is characterized by mounting thereon an electronic component sealed up by use of the above-mentioned Au—Ag—Sn-based solder alloy or the above-mentioned solder material.

Effect of the Invention

The present invention can provide, at a lower cost than conventional Au-based solder materials require, a solder material to be used at portions that are required to have very high reliability, such as crystal quartz devices, SAW filters and MEMS. Furthermore, since the solder alloy of the present invention is excellent in processability also, it enables manufacture of a lead-free solder material for high-temperature use at high productivity, to achieve much cost reduction. As a result, it is possible to provide an Au-based solder material having sufficient reflow wettability, excellent solder processability, and high reliability. Therefore, the contribution to industries is very large.

BRIEF DESCRIPTION OF THE DRAWINGS

FIG. 1. is a schematic diagram of a wettability test that shows a state where a chip is bonded to a Cu substrate having a Ni layer (plating) by soldering with a solder material of each sample.

MODE FOR CARRYING OUT THE INVENTION

As a result of devotion to the extensive researches, the present inventors have finally found that an Au-based solder alloy excellent in reflow wettability and solderability can be obtained by maintaining, in an appropriate range, not only the composition of additive elements but also the temperature range of the melting point determined by the solidus temperature and the liquidus temperature.

Hereinafter, the Au—Sn—Ag-based solder alloy of the present invention will be explained in detail. The Au—Sn—Ag-based solder alloy of the present invention is composed of Sn, Ag, Au and elements that are inevitably contained owing to a procedure for manufacturing, wherein the composition is adjusted so that the solidus temperature is within 280~400° C. with a gap between the solidus temperature and the liquidus temperature being within 40° C. With such a composition, sufficient reflow wettability can be maintained and excellent solderability can be obtained.

In addition, to satisfy the temperature range of the solidus temperature and the liquidus temperature, the solder alloy has a composition in which Sn of 21.1 mass % or more and less than 31.0 mass % is contained, Ag of 0.1 mass % or more but 12.5 mass % or less is contained and the balance is made up by Au except for elements that are inevitably contained owing to the procedure for manufacturing. By adopting such a composition, the cost of the Au-based solder alloy, which is very expensive, can be reduced.

Furthermore, by setting the surface roughness Ra after rolling to 1 μm or less, better wettability can be obtained.

In addition, by setting the cooling rate during solder alloy casting to 3° C./sec or more, much better reflow wettability can be obtained.

Hereinafter, essential elements of the solder alloy of the present invention will be explained in further detail.

<Au>

Au is a main component of the solder alloy of the present invention, and is an essential element. Since Au is substantially non-oxidizable, it is most suitable, in view of properties, as a sealing solder material and a bonding solder material for electronic components that are required to have high reliability. Therefore, Au-based solder materials are frequently used for sealing crystal quartz devices and SAW filters. The solder alloy of the present invention also is based on Au, and provides solder materials that belong to the technical fields where such high reliability is required. However, since Au is a very expensive metal, it often is avoided in view of cost, and is rarely used for electronic components that are required to have a common level of reliability. The solder alloy of the present invention is made as an Au—Sn—Ag alloy, to be comparable with the Au-20 mass % Sn solder alloy in reflow wettability and solder preformability, as well as to contribute to cost reduction with a reduced Au content.

<Sn>

Sn is an essential element in the solder alloy of the present invention. The Sn content is 21.1 mass % or more and less than 31.0 mass %. The reason is as follows. If the Sn content is 21.0 mass % or less in a composition to which Ag is added, primary crystals of $Au_5Sn_1$ intermetallic compound (hereinafter referred to as ζ phase) abruptly increase and the liquidus temperature sharply rises. As a result, too wide a gap between the liquidus temperature and the solidus temperature causes melting separation, to deteriorate the reflow wettability. Further, since the primary crystal grains of ζ phase grow large, the processability is significantly lowered. In addition, the Au content cannot be reduced and accordingly the cost reduction effect cannot be obtained. On the other hand, if the Sn content is 31.0 mass % or more, since $Au_1Sn_2$ intermetallic compound (hereinafter referred to as ε phase) is produced and is orthorhombic, the solder alloy gets brittle, to be difficult to process by rolling because of the extremely poor processability. Furthermore, $Ag_3Sn_1$ intermetallic compound and the like also are produced as primary crystals, to widen the gap between the liquidus temperature and the solidus temperature and deteriorate the reflow wettability. These property deteriorations ruin good wettability, which is a characteristic feature of Au-based solder materials, and make it difficult to obtain high bonding reliability, and thus the Sn content of 31.0 mass % or more is not preferable.

If the Sn content is 21.1 mass % or more but 27.5 mass % or less with an amount of Ag to be added being within the scope of the present invention, it is much preferable because the solidus temperature is 353° C. or lower and thus soldering can be performed under a good reflow wettability condition with a lowered soldering temperature and reduced effect of oxidation.

<Ag>

Ag is an essential element in the solder alloy of the present invention. In consideration of the heat resistance required for an instrumented device that uses a high-temperature type solder material, 260° C. or higher is required as the melting point of the alloy. In addition, since the upper limit of the reflow temperature is 400° C. in consideration of the device workability, it is necessary to set the melting point within 280~400° C. Further, by setting the solidus temperature and the liquidus temperature to be within 40° C., melting separation in reflowing does not occur and the reflow wettability is secured. For these reasons, it is necessary to have a composition with a melting point within 280~400° C. with a gap between the solidus temperature and the liquidus temperature being within 40° C.

In the alloy structure, a part of Au in ζ phase is substituted with Ag by addition of Ag, to form $(Au_{(1-x)}Ag_x)_5Sn_1$ intermetallic compound. To be specific, the ratio x of Au-substituting Ag by Ag addition is 0~⅔, and the Ag content is 0.1 mass % or more but 12.5 mass % or less. Further, it is important to arrange the composition so that the melting point is within 280~400° C. with a gap between the solidus temperature and the liquidus temperature being within 40° C., by controlling the ratio of AuSn intermetallic compound to $(Au_{(1-x)}Ag_x)_5Sn_1$ intermetallic compound, which are the constituents.

As described above, it is the Ag content of 0.1 mass % or more but 12.5 mass % or less at which the reflow wettability is secured without causing melting separation in reflowing as well as the processability can be improved by addition of Ag. An Ag content less than 0.1 mass % hardly effects improvement of performance or cost reduction. On the other hand, if 12.5 mass % is exceeded, since $Ag_3Sn_1$ intermetallic compound is produced and is orthorhombic, the alloy gets brittle, to be difficult to process by rolling because of the extremely poor processability. Furthermore, because of the generation of $Ag_3Sn_1$ intermetallic compound, the gap between the solidus temperature and the liquidus temperature grows too wide, to deteriorate the reflow wettability and the processability.

If the Ag content is 0.1 mass % or more but 8.0 mass % or less with an amount of Sn to be added being within the scope of the present invention, it is much preferable because the solidus temperature is 350° C. or lower an thus soldering can be performed under a good reflow wettability condition with a lowered soldering temperature and reduced effect of oxidation.

Furthermore, If the Ag content is 3.0 mass % or more but 8.0 mass % or less with an amount of Sn to be added being within the scope of the present invention, it is still much preferable because the solidus temperature is 350° C. or lower and thus soldering can be performed under a good reflow wettability condition with a lowered soldering temperature and reduced effect of oxidation as well as the reduction in Au use rate well effects the cost reduction.

Since Ag content of 3% or less involves poor Au-saving rate and thus cannot sufficiently effect cost saving, which is the initial object, the content of 3% or more is much preferable.

<Impurity>

The solder alloy of the present invention contains Au as a main component and Sn and Ag as essential additive elements. Inevitable impurities such as Cu and Ni may be contained in the solder alloy within a scope that does not affect the properties of the solder alloy of the present invention.

In a case where inevitable impurities are contained, it is desirable that the total is less than 100 ppm in consideration of the influence on the solidus temperature, wettability and bonding reliability.

<Production of Au—Sn—Ag-Based Solder Alloy>

The method for producing the Au-based solder alloy of the present invention is not particularly limited. It can be produced by a conventionally known method using the above-mentioned components.

As raw materials, fine ones having a diameter of 5 mm or smaller, particularly 3 mm or smaller in shot shape or processed piece are used. Use of fine ones is preferred because it facilitates formation of crystal grains smaller than 50 μm in a resulting solder alloy, thereby to improve processability.

These raw materials are placed in a melting furnace and heated to melt at 400~600° C., preferably at 450~500° C. under an atmosphere of nitrogen or inert gas for controlling oxidation of the raw materials. At this time, for example, a cylindrical graphite mold having an inner diameter of 30 mm or smaller and a wall thickness of approximately 10 mm can be used. Once the metals begin to melt, they are stirred well and stirring is continued sufficiently so that a local variation in composition should not occur. The stirring time varies depending on the apparatus and the quantity of the raw materials, but it is preferably 1~5 minutes.

After that, a material having a high thermal conductivity, for example, a cooling metal made of Cu is brought into close contact with the outside of this mold. Desirably, upon a cooling metal being made to have a hollow structure, the cooling metal through which cooling water passes is brought into close contact with the outside of the mold, to achieve, while depending on the composition, the cooling rate of 3° C./sec or more up to about 280° C. Setting such a cooling rate makes it possible to fine down the lamellar structure as an eutectic portion to 5 μm or finer, to improve wettability and thus is preferable.

Further, rapid cooling and solidification at the cooling rate of 20° C./sec or more further improves wettability and thus is much preferable. This is because it makes it possible to produce steadily and stably ingots of the solder alloy in which the size of crystal grains of most precipitates other than the eutectic lamellar structure is less than 20 μm.

In addition, in a case where the continuous casting method is applied in consideration of productivity, it is preferable to shape ingots formed by continuous casting to have a small cross-sectional area, because it can improve the cooling rate. For example, it is preferable to use a die with an inside diameter of 30 mm or less as well as to cool the die at a cooling rate of 50° C./sec or more upon covering the die with a water cooling jacket for cooling and solidifying the molten metal in a short time.

In the Au—Sn—Ag-based solder alloy of the present invention thus obtained, the solidus temperature is within the range of 280 to 400° C. with a gap between the solidus temperature and the liquidus temperature being within 40° C. Because of this property, a stable reflow wettability is assured without melting separation caused during bonding to a substrate in a reflow oven, and thus a good solder bonding inside an electronic device can be achieved.

The solidus temperature, which is measured by use of a differential scanning calorimeter (DSC), preferably is 280° C. or higher but 400° C. or lower. Further, since a melting point of 350° C. or lower allows the soldering temperature to be lowered to reduce influence of oxidation and improve the reflow workability, it is much preferable that the solidus temperature is 280° C. or higher but 350° C. or lower.

Those having a solidus temperature of less than 280° C. are not expected to have sufficient heat resistance and thus are not preferable. In a composition where the solidus temperature exceeds 400° C., the reflow temperature also needs to be higher than 400° C. If 400° C. is exceeded, the influence of oxidation or the like owing to residual oxygen grows conspicuous and the wettability extremely deteriorates, which is not preferable. Further, an increased reflow temperature also causes deteriorated workability as compared with others and thus is not preferable. When the solidus temperature is 350° C. or lower, it is much preferable because the influence of oxidation by residual oxygen hardly appears.

The liquidus temperature is confirmed by measurement using a differential scanning calorimeter (DSC) and a melting test. The gap between the solidus temperature and the liquidus temperature is required to be within 40° C., and setting the gap within 20° C. is much preferable.

If the gap between the solidus temperature and the liquidus temperature exceeds 40° C., there may be a portion kept solidified for a while even if melting starts. As a result, the wettability becomes non-uniform and melting proceeds in a distorted molten form, to fall in a condition where anomaly appears at bonded surfaces and the range of bonding, and thus the gap exceeding 40° C. is not preferable. If the gap between the solidus temperature and the liquidus temperature is within 20° C., since melting can start almost simultaneously, the molten form is allowed to be much uniform and better, and thus the gap within 20° C. is much preferable.

In the Au—Sn—Ag-based solder alloy of the present invention, the surface roughness Ra after rolling of 1.0 μm or less improves the wettability and thus is preferable. Ra of 0.7 μm or less much improves the wettability and thus is much preferable. Regarding the measurement of the surface roughness Ra, the surface roughness Ra of each sample processed into a sheet is measured with a laser microscope (LEXT OLS 4000) equipped with a surface roughness meter and the arithmetic average roughness Ra is calculated. Japanese Industrial Standard JIS B0601 (1994) is referred to for this arithmetic average roughness Ra.

The Au-based solder alloy of the present invention is used for bonding and sealing of electronic components, and facilitates manufacture of electronic component mounting substrate.

Embodied Examples

The present invention will be explained in more detail with reference to embodied examples, but the present invention is not limited to these examples.

Production was carried out while controlling the cooling rate in accordance with the above-mentioned production method, and as a specific mold, one which can obtain a plate-shaped alloy for rolling with a thickness of 3 mm, a width of 40 mm and a length of 150 mm was used, to prepare a master solder alloy of Specimen 1. Master solder alloys of Specimens 2~34 were prepared in the same manner as Specimen 1 except that the mixing ratio of the raw materials was changed. Next, each master solder alloy of Specimens 1~34 was processed into a sheet using a warm rolling machine.

The measurement method and evaluation method of the prepared samples will be described below.

1. Method for Measuring Samples

Each measurement method is described below, and the results are shown in Table 1 below.

(1) Composition Analysis

Composition analysis was carried out using an ICP emission spectroscopic analyzer (SHIMAZU S-8100).

(2) Solidus Temperature and Liquidus Temperature

They were measured with a differential scanning calorimeter (DSC) and a melting test.

(3) Measurement of Surface Roughness

The surface roughness of each sample processed into a sheet was measured with a laser microscope (LEXT OLS 4000) equipped with a surface roughness meter, and the average roughness Ra was calculated.

15~30 cm/sec, the roll temperature was 250° C., and each sample was rolled thinner down to 50.0±2.5 μm through five times of rolling. After the rolling of each sample, the evaluation of processability was made such that, per 10 m of the sheet, a case where no crack or burr was generated was ranked as "good", and a case where one or more cracks or burrs were generated was ranked as "faulty".

(2) Reflow Wettability

Using a solder material as punched out into a 3 mm square with the thickness of 50 μm, a test of bonding with a substrate was conducted in a reflow oven described below and the wettability was evaluated.

First, in a reflow wettability testing machine (apparatus name: controlled atmosphere wettability testing machine), nitrogen was flowed from four portions around the heater section (nitrogen flow rate: 12 L/min each), and the set temperature for the heater was adjusted to 380° C. and heating was carried out.

TABLE 1

| Specimen | Solder Alloy Composition (mass %) | | | Solidus Temperature | Liquidus Temperature | Gap between Liquidus Temp & Solidus Temp | Surface Roughness | Cooling Rate |
|---|---|---|---|---|---|---|---|---|
| | Au | Ag | Sn | ° C. | ° C. | ° C. | (μm) | ° C./sec |
| 1 | 56.6 | 12.5 | 30.9 | 368 | 383 | 15 | 0.6 | 3.1 |
| 2 | 57.2 | 12.0 | 30.8 | 373 | 382 | 9 | 0.6 | 3.1 |
| 3 | 64.2 | 9.4 | 26.4 | 353 | 374 | 21 | 0.5 | 3.1 |
| 4 | 67.0 | 8.0 | 25.0 | 337 | 360 | 23 | 0.5 | 3.1 |
| 5 | 69.7 | 6.6 | 23.7 | 326 | 350 | 24 | 0.4 | 3.1 |
| 6 | 72.2 | 5.0 | 22.8 | 315 | 340 | 25 | 0.4 | 3.1 |
| 7 | 73.2 | 4.4 | 22.4 | 305 | 330 | 25 | 0.4 | 3.1 |
| 8 | 74.7 | 3.3 | 22.0 | 300 | 320 | 20 | 0.4 | 3.1 |
| 9 | 75.9 | 2.5 | 21.6 | 290 | 305 | 15 | 0.4 | 3.1 |
| 10 | 78.8 | 0.1 | 21.1 | 280 | 295 | 15 | 0.4 | 3.1 |
| 11 | 73.0 | 5.0 | 22.0 | 310 | 340 | 30 | 0.6 | 5 |
| 12 | 69.5 | 5.0 | 25.5 | 320 | 347 | 27 | 0.5 | 5 |
| 13 | 67.6 | 5.0 | 27.4 | 330 | 362 | 32 | 0.7 | 5 |
| 14 | 67.2 | 6.6 | 26.2 | 335 | 363 | 28 | 0.6 | 5 |
| 15 | 64.6 | 8.0 | 27.4 | 340 | 365 | 25 | 0.7 | 5 |
| 16 | 62.5 | 8.1 | 29.4 | 343 | 380 | 37 | 0.8 | 5 |
| 17 | 60.2 | 12.0 | 27.8 | 363 | 385 | 22 | 0.8 | 5 |
| 18 | 69.7 | 6.6 | 23.7 | 326 | 350 | 24 | 1.1 | 5 |
| 19 | 69.7 | 6.6 | 23.7 | 326 | 350 | 24 | 0.5 | 2.8 |
| 20 | 78.8 | 0.1 | 21.1 | 280 | 295 | 15 | 1.1 | 3.1 |
| 21 | 78.8 | 0.1 | 21.1 | 280 | 295 | 15 | 0.8 | 2.8 |
| 22 | 67.0 | 8.0 | 25.0 | 337 | 360 | 23 | 1.1 | 3.1 |
| 23 | 67.0 | 8.0 | 25.0 | 337 | 360 | 23 | 0.8 | 2.8 |
| 24 | 62.5 | 8.1 | 29.4 | 343 | 380 | 37 | 1.1 | 5 |
| 25 | 62.5 | 8.1 | 29.4 | 343 | 380 | 37 | 0.8 | 2.8 |
| 26 | 62.5 | 8.1 | 29.4 | 343 | 380 | 37 | 0.5 | 20 |
| *27 | 73.9 | 5.0 | 21.1 | 305 | 347 | 42 | 0.5 | 5 |
| *28 | 71.9 | 6.6 | 21.5 | 315 | 360 | 45 | 0.5 | 5 |
| *29 | 61.6 | 8.0 | 30.4 | 343 | 385 | 42 | 0.5 | 5 |
| *30 | 60.7 | 8.4 | 30.9 | 345 | 387 | 42 | 0.5 | 5 |
| *31 | 63.3 | 12.7 | 24.0 | 294 | 350 | 56 | 0.5 | 5 |
| *32 | 58.0 | 7.0 | 35.0 | 294 | 410 | 116 | 0.7 | 5 |
| *33 | 65.0 | 15.0 | 20.0 | 351 | 451 | 100 | 0.5 | 5 |
| *34 | 66.45 | 0.05 | 33.5 | 280 | 405 | 125 | 0.7 | 5 |

(Note)
Specimens marked with * in the table are reference examples.

2. Method for Evaluating Samples

Each evaluation method is described below and the results are shown in Table 2 below.

(1) Processability of Solder Alloy

Each of the master solder alloys of Specimens 1~34 was processed into a sheet shape with a warm rolling machine, and the processability was evaluated by the incidence of cracks and the like.

The rolling conditions were the same for all the samples; the number of times of rolling was 5, the rolling speed was After the testing machine was sufficiently filled with nitrogen and the heater temperature came to be stable at the set value, a Cu substrate 1 (thickness: 0.3 mm) plated with Ni (film thickness: 3.0 μm) was set in the heater section and heated for 25 seconds. Next, a solder material 2 of each of Specimens 1~34 was placed on the Cu substrate 1 and heated for 25 seconds, and then the 3 mm SQ chip 3 was placed on the solder material 2 and bonded, to form a joined body shown in FIG. 1. After the bonding, the Cu substrate was cooled in a cooling zone under an atmosphere of nitrogen and then was taken out into the air.

In order to check the bondability, a test was carried out for ten samples, and the evaluation of reflow wettability was made such that, a case where the solder alloy spread beyond the 3 mm SQ chip and formed a fillet was ranked as "excellent", a case where the solder alloy spread across the 3 mm SQ chip but formed a fillet only partially was ranked as "good", a case where the solder alloy spread across the 3 mm SQ chip but did not form a fillet on any of the four sides was ranked as "passable", and a case where there was produced one or more samples in which the spread of solder alloy was poor and smaller than the chip size was ranked as "faulty".

The term "fillet" refers to the shape of a spreading skirt, formed by a bonded solder alloy wetting and spreading over the side faces of the chip and the Cu substrate.

(3) Bonding Reliability

Using this joined body, first, a solder heat resistance test of 10 seconds at 260° C. was carried out three times. Then, a heat cycle test of −55° C./125° C. was performed for 300 cycles. After that, the joined portion was observed upon cross-section polishing.

The evaluation of reliability was made such that, a case where there was generated no crack in the chip or the joined portion was evaluated as "good", and a case where a crack was generated was evaluated as "faulty".

If no fault is found in the above evaluation, the standard of bonding reliability is met. In consideration of use in a harsher environment, however, 500-cycle test also was conducted with respect to the samples in which no fault was found in the 300-cycle test, for checking higher bonding reliability.

TABLE 2

| Specimen | Processsability of Solder Alloy | Reflow Wettability | Bonding Reliability (cycle) | |
|---|---|---|---|---|
| | | | 300 | 500 |
| 1 | Good | Good | Good | Faulty |
| 2 | Good | Good | Good | Faulty |
| 3 | Good | Good | Good | Faulty |
| 4 | Good | Excellent | Good | Good |
| 5 | Good | Excellent | Good | Good |
| 6 | Good | Excellent | Good | Good |
| 7 | Good | Excellent | Good | Good |
| 8 | Good | Excellent | Good | Good |
| 9 | Good | Excellent | Good | Good |
| 10 | Good | Excellent | Good | Good |
| 11 | Good | Excellent | Good | Good |
| 12 | Good | Excellent | Good | Good |
| 13 | Good | Excellent | Good | Good |
| 14 | Good | Excellent | Good | Good |
| 15 | Good | Excellent | Good | Good |
| 16 | Good | Good | Good | Faulty |
| 17 | Good | Good | Good | Faulty |
| 18 | Good | Passable | Good | Faulty |
| 19 | Good | Passable | Good | Faulty |
| 20 | Good | Passable | Good | Faulty |
| 21 | Good | Passable | Good | Faulty |
| 22 | Good | Passable | Good | Faulty |
| 23 | Good | Passable | Good | Faulty |
| 24 | Good | Passable | Good | Faulty |
| 25 | Good | Passable | Good | Faulty |
| 26 | Good | Excellent | Good | Good |
| *27 | Faulty | Faulty | Faulty | — |
| *28 | Faulty | Faulty | Faulty | — |
| *29 | Faulty | Faulty | Faulty | — |
| *30 | Faulty | Faulty | Faulty | — |
| *31 | Faulty | Faulty | Faulty | — |
| *32 | Faulty | Faulty | Faulty | — |
| *33 | Faulty | Faulty | Faulty | — |
| *34 | Faulty | Faulty | Faulty | — |

(Note)
Specimens marked with * in the table are reference examples.

As can be seen from Table 2 above, among Specimens 1~26, which satisfy the requirements of the present invention, the master solder alloys of Specimens 4~15 in particular showed good characteristics in each evaluation item. That is, their processability was good without generating cracks even if processed into a sheet, and it is understood that their solderability was excellent as compared with the reference examples 27~34. The reflow wettability of Specimens 4~15 was "excellent", and good results were obtained also in the heat cycle test which is an evaluation regarding reliability, and no fault was found even after 500 cycles. Although Specimens 9~10 passed all the items for evaluation, an addition amount of Ag was small in comparison with Specimens 4~8 and 11~15 and an increased amount of Sn from the conventional composition of 20.0% was also small. Therefore, the reduction amount of Au is 5% or less, and thus little contributes to cost cutting.

Regarding the samples of Specimens 1~3 and 16~17, in which the Ag content was 8.1% or more and the Sn content was 26.4% or more, the reflow wettability was somewhat decreased as compared with Specimens 4~15; with insufficient fillet formation being recognized in some of the samples, the reflow wettability was ranked as "good". In the heat cycle test, there was no generation of fault after 300 cycles, but after 500 cycles, incidence of cracks were found at portions where the fillet was insufficient, to be ranked as faulty. It is inferred that, with the insufficient formation of fillet failing to disperse the thermal stress, the stress was applied and generated cracks. Since Specimen 2 was almost ternary eutectic and Specimen 1 also was close thereto, their solidus-liquidus temperature gap was so small as 20° C. or lower. Regarding Specimen 3 and Specimen 17 also, the solidus-liquidus temperature gap was so small about 21~22° C. Nevertheless, their reflow wettability was ranked as "good", because they had a solidus temperature of 350° C. or higher and accordingly the reflow temperature was risen so that oxidation or the like had an influence.

Regarding the samples of Specimens 18, 20, 22 and 24, both of Ag and Sn were within the specified composition range, the solidus-liquidus temperature gap was within 40° C., and the processability of the solder alloys was good. These were, however, rough samples having a rolled surface as processed with a surface roughness of 1.1 μm, which is greater than 1.0 μm, and the reflow wettability was deteriorated. Although the solder alloys were spread to the chip size, they scarcely formed a fillet and thus were ranked as "passable". In the heat cycle test, there was no generation of fault after 300 cycles, but after 500 cycles, incidence of cracks were found, to be ranked as faulty.

Regarding the samples of Specimens 19, 21, 23, and 25, both of Ag and Sn were within the specified composition range, the solidus-liquidus temperature gap was within 40° C., and the processability of the solder alloys was good. These were, however, samples that had been cooled at a slower cooling rate during casting, with uncontrolled size of crystal grains to have a coarse lamellar structure, and thus their reflow wettability was deteriorated, to be ranked as "passable". In the heat cycle test, there was no generation of fault after 300 cycles, but after 500 cycles, incidence of cracks were found, to be ranked as faulty.

The samples of Specimen 26 were those having the same composition as Specimen 16, in some samples of which insufficient fillet formation was recognized after melting, but having been cooled at a faster cooling rate during casting. Compared with Specimens 16 and 25 having the same composition, the size of crystal grains generated in the primary crystal got finer, to facilitate melting, and thus their reflow wettability was improved, to be ranked as "excellent". In the heat cycle test, there was no generation of fault after 300 cycles, and no fault was recognized after 500 cycles, either. It is inferred that since the size of crystal grains in the primary crystal component got finer by increased cooling rate, non-homogeneousness in melting was eliminated.

On the other hand, the solder alloys of the reference examples 27 to 34, which did not satisfy the requirements of the present invention, were faulty in all the characteristics.

Regarding the samples of Specimens 27~30, both of the elements Ag and Sn were within the specified composition range of the present invention, but the solidus-liquidus temperature gap exceeded 40° C. and faults occurred both in the reflow wettability and the processability of solder alloys.

In Specimen 27, Ag content was 5.0 mass % and Sn content was 21.1 mass %. If Ag content is 5.0 mass %, the solidus-liquidus temperature gap comes to be minimum when Sn content is 22.8 mass %. In the case where Sn is 21.1 mass %, since the amount of $(Au, Ag)_5Sn_1$ increased and the liquidus temperature rose, the solidus-liquidus temperature gap exceeded 40° C. In the case of Specimen 28 as well, since the amount of $(Au, Ag)_5Sn_1$ increased and the liquidus temperature rose, the solid-liquid temperature gap exceeded 40° C. On the other hand, in the case of Specimens 29 and 30, since Ag content was small for the large amount of Sn, the amount of $Au_1Sn_1$ increased and the liquidus temperature rose, and accordingly the solidus-liquidus temperature gap exceeded 40° C.

In the samples of Specimens 31~34, Ag or Sn was out of the specified composition range, the solidus-liquidus temperature gap exceeded 40° C., and faults occurred both in the reflow wettability and the processability of solder alloys.

The solder material of the present invention is not only satisfactory in each of the above-mentioned characteristics, but also has a totally small Au content. As can be understood, it is possible to reduce the Au content to be substantially smaller than that in Au-20 mass % Sn, which is the most common eutectic composition among Au—Sn-base solder alloys, and to achieve cost reduction.

DESCRIPTION OF THE REFERENCE SYMBOLS

1 Cu substrate with Ni plating
2 solder material
3 SQ chip

The invention claimed is:
1. An Au—Sn—Ag-based solder alloy containing Au, Sn, Ag and elements that are inevitably contained owing to a procedure for manufacturing,
wherein the Au—Sn—Ag-based solder alloy has a composition adjusted so that a solidus temperature is within a range of 280 to 400° C. with a gap between the solidus temperature and a liquidus temperature being within 40° C.,
wherein the Au—Sn—Ag-based solder alloy contains Sn of 21.1 mass % or more and less than 31.0 mass %, Ag of 0.1 mass % or more and 12.5 mass % or less, and a balance of Au except for the elements that are inevitably contained owing to the procedure for manufacturing, and
wherein the Au—Sn—Ag-based solder alloy has a lamellar structure as a eutectic portion of 5 μm or finer.
2. The Au—Sn—Ag-based solder alloy according to claim 1,
wherein the Au—Sn—Ag-based solder alloy contains Sn of 21.1 mass % or more and less than 31.0 mass % and contains Ag of 0.1 mass % or more but 8.0 mass % or less.
3. The Au—Sn—Ag-based solder alloy according to claim 1,
wherein the Au—Sn—Ag-based solder alloy contains Sn of 21.1 mass % or more and less than 27.5 mass % and contains Ag of 3.0 mass % or more but 8.0 mass % or less.
4. The Au—Sn—Ag-based solder alloy according to a claim 1,
wherein a surface roughness after rolling is 1 μm or less.
5. A solder material processed into a frame shape, a sheet shape or a ribbon shape by use of the Au—Sn—Ag-based solder alloy according to claim 1.
6. An electronic component sealed up by use of the Au—Sn—Ag-based solder alloy according to claim 1.
7. An electronic component mounting device mounting thereon the electronic component according to claim 6.
8. An electronic component sealed up by use of the solder material according to claim 5.
9. An electronic component mounting device mounting thereon the electronic component according to claim 8.

* * * * *